(12) United States Patent
Dussarrat et al.

(10) Patent No.: US 12,368,152 B2
(45) Date of Patent: Jul. 22, 2025

(54) COMPOUND AND METHOD FOR PRODUCING LITHIUM-CONTAINING FILM

(71) Applicant: L'Air Liquide Société Anonyme pour l'Etude et l'Exploitation des Procédés Georges Claude, Paris (FR)

(72) Inventors: Christian Dussarrat, Tokyo (JP); Vincent Duplan, Yokohama (JP); Yumi Ikeda, Ota-ku (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 1021 days.

(21) Appl. No.: 17/429,249

(22) PCT Filed: Dec. 17, 2019

(86) PCT No.: PCT/JP2019/049411
§ 371 (c)(1),
(2) Date: Mar. 25, 2022

(87) PCT Pub. No.: WO2020/162049
PCT Pub. Date: Aug. 13, 2020

(65) Prior Publication Data
US 2022/0231268 A1    Jul. 21, 2022

(30) Foreign Application Priority Data
Feb. 6, 2019    (JP) .................. 2019-019632

(51) Int. Cl.
| H01M 4/04 | (2006.01) |
| C07F 19/00 | (2006.01) |
| H01M 4/139 | (2010.01) |
| H01M 4/36 | (2006.01) |
| H01M 4/62 | (2006.01) |
| H01M 10/42 | (2006.01) |

(52) U.S. Cl.
CPC .......... *H01M 4/0428* (2013.01); *C07F 19/00* (2013.01); *H01M 4/139* (2013.01); *H01M 4/366* (2013.01); *H01M 4/62* (2013.01); *H01M 10/4235* (2013.01)

(58) Field of Classification Search
None
See application file for complete search history.

(56) References Cited

U.S. PATENT DOCUMENTS

| 2012/0276305 A1 | 11/2012 | Hamalainen et al. |
| 2013/0260024 A1 | 10/2013 | Jodin et al. |
| 2017/0365854 A1 | 12/2017 | Gopalakrishnannair et al. |

FOREIGN PATENT DOCUMENTS

| JP | 2013 214510 | 10/2013 |
| JP | 2014 500401 | 1/2014 |
| TW | 2018 10776 | 3/2018 |
| WO | WO 00 67300 | 11/2000 |
| WO | WO 02 27063 | 4/2002 |
| WO | WO 2005 008828 | 1/2005 |
| WO | WO 2011 002920 | 1/2011 |

OTHER PUBLICATIONS

Henderson et al.; "Effect of Polydentate Donor Molecules on Lithium Hexamethyldisilazide Aggregation: An X-ray Crystallographic and a Combination Semiempirical PM3/Single Point ab Initio Theoretical Study"; J. Am. Chem. Soc. 1997, 119, 11855-11863. (Year: 1997).*

(Continued)

*Primary Examiner* — Gregg Cantelmo
(74) *Attorney, Agent, or Firm* — Allen E. White

(57) ABSTRACT

The present invention provides a compound having a low melting point, enhanced volatility, and excellent thermal stability, and a method for producing a lithium-containing film. The compound is represented by the following formula (1).

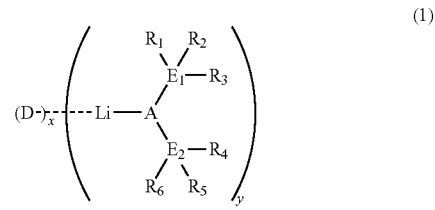

(In the formula (1), A is a nitrogen atom, a phosphorus atom, a boron atom, or an aluminum atom;

$E_1$ and $E_2$ are independently a carbon atom, a silicon atom, a germanium atom, or a tin atom;

$R_1$ to $R_6$ are independently a hydrogen atom or a C1-10 hydrocarbon group having a constituent atom optionally substituted with a heteroatom; however, all of $R_1$ to $R_6$ may not be a hydrogen atom;

D is a monodentate or polydentate neutral ligand structure;

x is 0 or an integer of 1 or greater, and y is an integer of 1 or greater; however, if A is a nitrogen atom and none of the carbon atoms constituting $R_1$ to $R_6$ is substituted with a heteroatom, x is a number of 1 or greater and y is a number of 1 or greater; and if there are more than one of A, $E_1$, $E_2$, and $R_1$ to $R_6$, these may be the same or different).

6 Claims, 3 Drawing Sheets

(56) References Cited

OTHER PUBLICATIONS

Ozerov, O.V. et al., Double silyl migration converting Ore[N(SiMe$_2$CH$_2$PCy$_2$)$_2$] to NRe[O(SiMe$_2$CH$_2$PCy$_2$)$_2$] substructures, Inorg. Chem. 2002, 41, 5615-5625.
International Search Report for corresponding PCT/JP2019/049411, Feb. 4, 2020.

* cited by examiner

[Fig. 1]
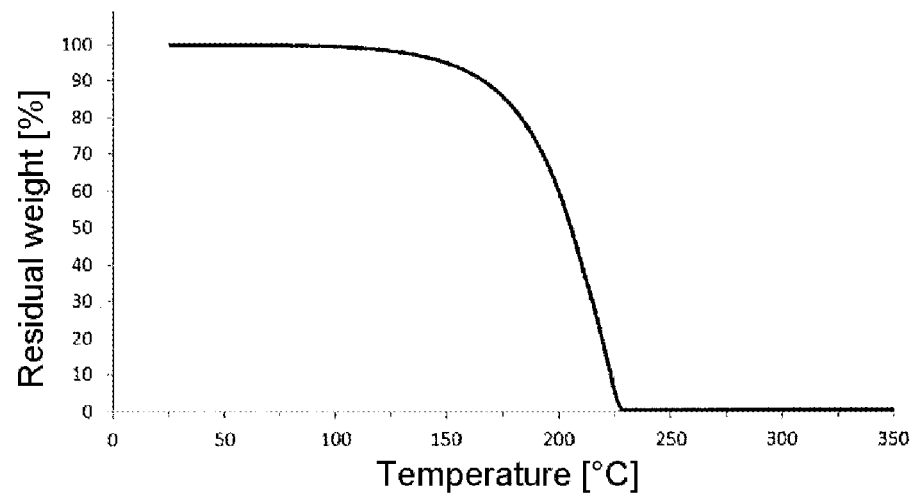
[Fig. 2]
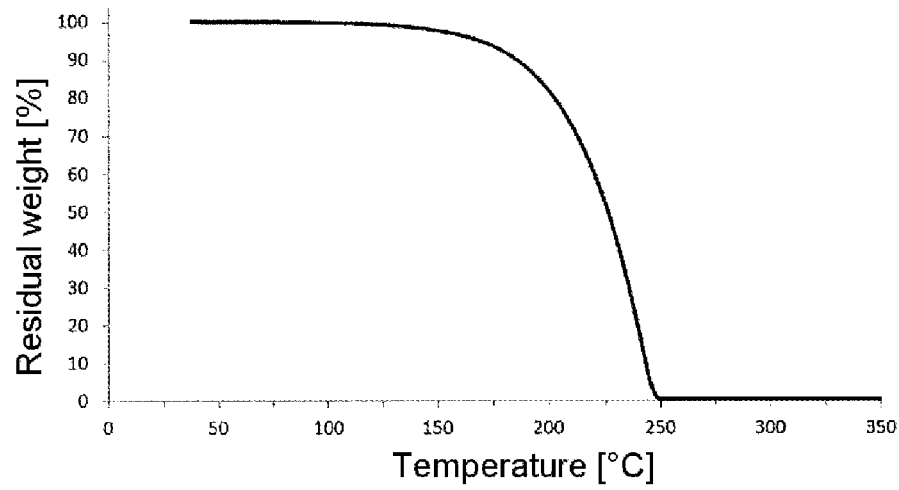

[Fig. 3]
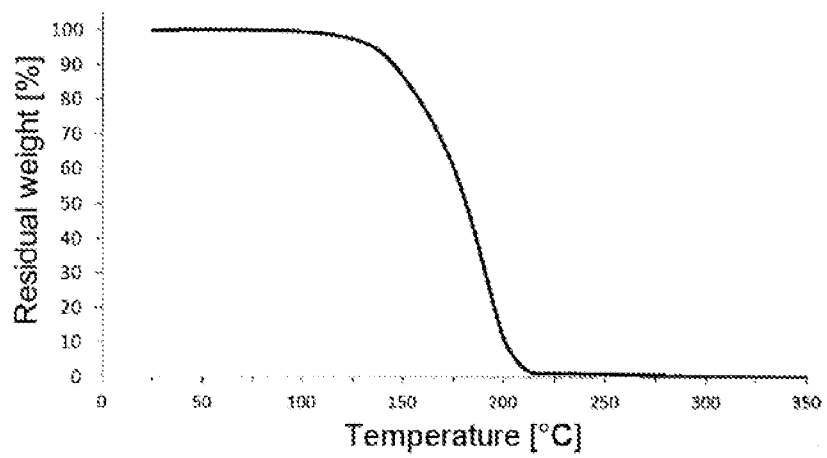
[Fig. 4]
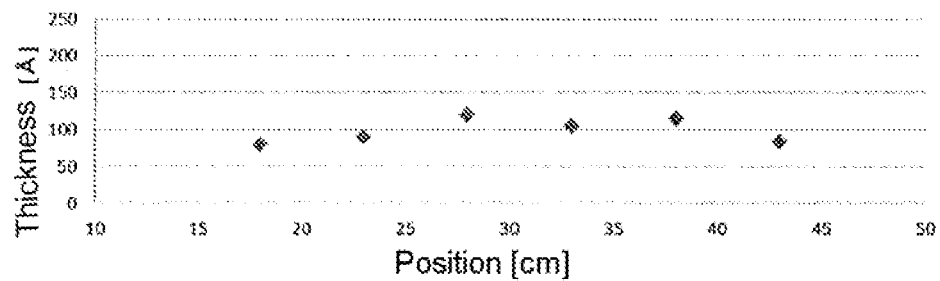
[Fig. 5]
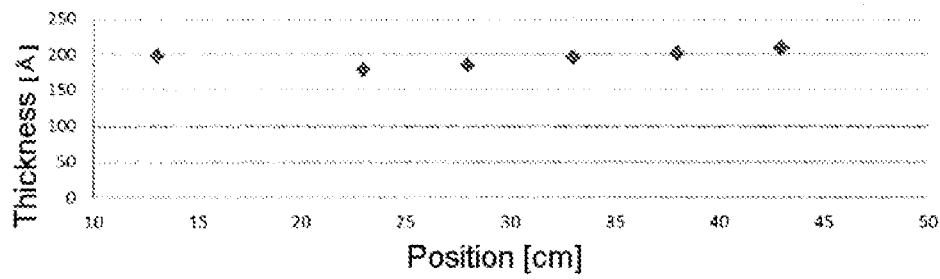

[Fig. 6]
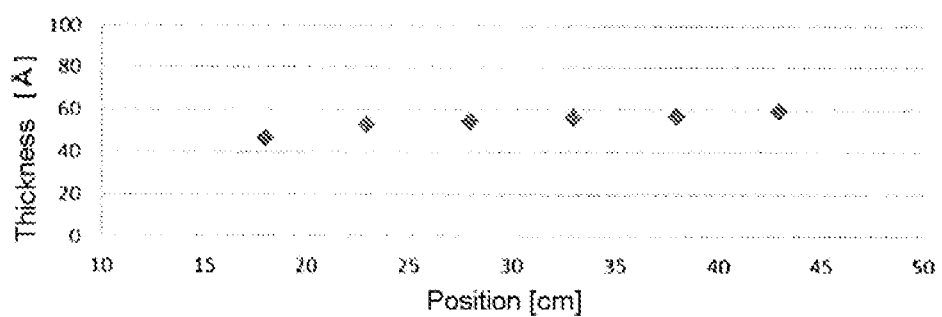
[Fig. 7]
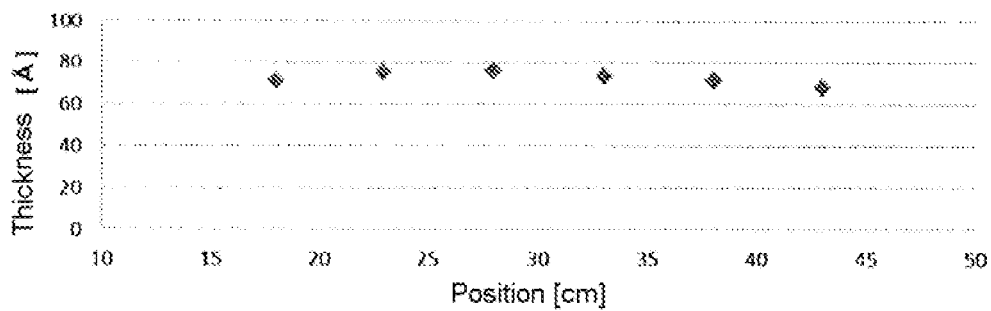

COMPOUND AND METHOD FOR PRODUCING LITHIUM-CONTAINING FILM

CROSS REFERENCE TO RELATED APPLICATIONS

This application is a 371 of International Application No. PCT/JP2019/049411, filed Dec. 17, 2019, which claims priority to Japanese Patent Application No. 2019-019632, filed Feb. 6, 2019, the entire contents of which are incorporated herein by reference.

TECHNICAL FIELD

The present invention relates to a compound and a method for producing a lithium-containing film.

BACKGROUND ART

Lithium-containing thin films are widely used as a surface coating layer of an electrode material in lithium ion battery applications. During the first cycle of a lithium ion battery, a solid electrolyte interface (SEI) is observed to form on the anode and/or the cathode due to decomposition of the electrolyte at the electrolyte/electrode interface. Consumption of lithium causes loss of capacity in a lithium ion battery. The SEI layer formed becomes uneven and unstable, and cracks and dendrite crystals appear, which can cause thermal runaway. A barrier potential is further formed in the SEI layer, which makes intercalation (insertion) to the electrode more difficult.

Coating the electrode surface by atomic layer deposition (ALD) or chemical vapor deposition (CVD) is the method of first choice for forming the intended solid electrolyte interface thin film, and therefore avoids forming these unstable layers. A lithium-containing thin film is a very desirable candidate for a protective electrode coating by virtue of its good conductivity and high electrochemical stability.

Another important application of a lithium-containing thin film is for forming a solid electrolyte material used in a solid-state battery. A solid-state battery is a solvent-free system that has a longer life, a faster charge time, and a higher energy density than conventional lithium ion batteries. The following technical step may be considered during development of these batteries. A solid electrolyte comprising a lithium-containing thin film, such as lithium phosphate, lithium borate, or lithium borophosphate, is deposited by ALD/CVD. This can give an even, conformal lithium-containing thin film even on a complex structure such as a 3D battery.

Various methods have been hitherto reported for forming a lithium-containing film, including for lithium battery applications and other applications (for example, Patent Documents 1 to 4).

PRIOR ART DOCUMENTS

Patent Literature 1: WO 00/67300 A1
Patent Literature 2: WO 02/27063 A2
Patent Literature 3: WO 2011/002920 A2
Patent Literature 4: US 2012/0276305 A1

SUMMARY OF THE INVENTION

Previous lithium compounds for forming a lithium thin film, however, have the following problems.

First, lithium compounds are present as various aggregates in a solution or a solid state. These molecules usually have a multimer, typically a trimer or tetramer, structure, which gives high molecular weight, a high melting point, and low volatility. For example, n-BuLi is a tetramer in diethyl ether and a hexamer in cyclohexane. Since lithium compounds are not very volatile, only the quickly delivered portion is heated when heating to a high temperature is necessary. The remaining lithium compound is held in a "mother tank" under ambient conditions. In this case, it is important to supply the residual lithium compound by a practical method to a tank heated to a high temperature. Additionally, delivering a solid at a stable supply rate brings about difficulties when taking account of changes in the form thereof. Typically, smaller particles have a high surface bulk ratio and larger particles are consumed more quickly. Conversely, melting the particles may potentially destabilize the supply rate.

Therefore, a volatile, liquid lithium compound is required in this technical field, especially in the semiconductor industry. When the lithium compound is a liquid, the flow rate can be accurately measured and/or controlled and the liquid can be transferred and filled through a tank simply by opening a valve.

Next, organic lithium compounds such as an alkyl lithium or a lithium amide are a well-known type of lithium compound, and these usually have high reactivity and moisture sensitivity, and may sometimes be a pyrophoric species. These lithium compounds normally require special safety measures, as will be understood from the fact that they are commercially available in a solution.

A well-known ALD/CVD process for forming a lithium-containing thin film typically proceeds at a temperature of between 250° C. and 350° C. These temperatures are permissible when deposition occurs on a component such as an active material powder. These temperatures are not suitable for deposition on a temperature-sensitive material such as a lithium ion battery electrode.

The present invention takes account of these problems, and an object of the present invention lies in providing a compound having a low melting point, enhanced volatility, and excellent thermal stability, and a method for producing a lithium-containing film.

As a result of diligent study, the inventors discovered that the object can be achieved by adopting the following configuration, and so perfected the present invention.

In one embodiment, the present invention relates to a compound represented by the following formula (1).

Chemical Expression 1

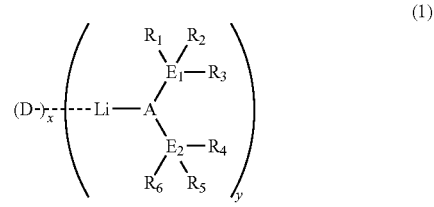

(In the formula (1), A is a nitrogen atom, a phosphorus atom, a boron atom, or an aluminum atom;
$E_1$ and $E_2$ are independently a carbon atom, a silicon atom, a germanium atom, or a tin atom;
$R_1$ to $R_6$ are independently a hydrogen atom or a C1-10 hydrocarbon group having a constituent atom optionally substituted with a heteroatom; however, all of $R_1$ to $R_6$ may not be a hydrogen atom;

D is a monodentate or polydentate neutral ligand structure;

x is 0 or an integer of 1 or greater and y is an integer of 1 or greater; however, if A is a nitrogen atom and none of the carbon atoms constituting $R_1$ to $R_6$ is substituted with the heteroatom, x is a number of 1 or greater and y is a number of 1 or greater; and if there are more than one of A, $E_1$, $E_2$, and $R_1$ to $R_6$, these may be the same or different.)

The compound represented by the formula (1) (hereafter also called "compound (1)") has a lower melting point, higher volatility, and better thermal stability than conventional lithium compounds. As a result, a vapor deposition process at a lower temperature can be carried out to enable the formation of a lithium-containing film even on a temperature-sensitive material such as a lithium ion battery electrode. Although the reason for which these characteristics are obtained is not exactly known, the following is hypothesized. Introducing a specific bulky ligand or substituent to lithium atoms increases the saturation of the ligand sphere of the compound (1) (the space that can be involved in coordination around the compound) and has a delaying effect on oligomerization of compounds (1). As a result, this seems to lower the melting point of the compound (1) and exhibit volatility. The bulkiness also gives the compound (1) structural stability, which seems to lead to thermal stability. However, the present invention is not bound to these theories.

In one embodiment, the compound is preferably represented by the following formula (i).

Chemical Expresssion 2

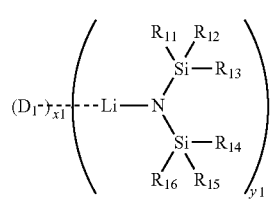

(In the formula (i), $R_{11}$ to $R_{16}$ are independently a hydrogen atom or a C1-10 alkyl group having a constituent atom optionally substituted with a heteroatom; however, all of $R_{11}$ to $R_{16}$ may not be a hydrogen atom;

$D_1$ is a bidentate or tridentate neutral ligand structure; and x1 and y1 are independently an integer of 1 or greater.)

The compound represented by the formula (i) (hereafter also called "compound (i)") has a chelate structure introduced by the bulkier polydentate ligand, which is preferred in terms of greater improvement in low melting point, high volatility, and thermal stability.

In one embodiment, $R_{11}$ to $R_{16}$ in the compound (i) are preferably all methyl groups;

$D_1$ is preferably 1,2-diethoxyethane, diethylene glycol dimethyl ether, N,N,N',N'-tetramethylethylenediamine, N,N,N',N'-tetraethylethylenediamine, N,N,N',N'-tetramethyl-1,3-diaminopropane, or N,N,N',N'',N''-pentamethyldiethylenetriamine; and x1 and y1 are preferably 1.

By specifically having this structure, the compound (i) can achieve a low melting point, high volatility, and a high level of thermal stability.

In another embodiment, this compound is preferably represented by the following formula (ii).

Chemical Expression 3

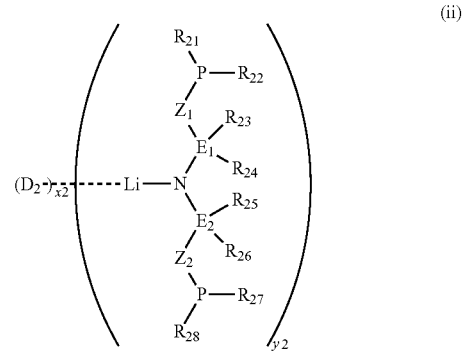

(In the formula (ii), $E_1$ and $E_2$ are defined the same as in the formula (1);

$Z_1$ and $Z_2$ are independently a single bond or a divalent linking group;

$R_{21}$ to $R_{28}$ are independently a hydrogen atom or a C1-10 alkyl group having a constituent atom optionally substituted with a heteroatom; however, all of $R_{21}$ to $R_{28}$ may not be a hydrogen atom;

$D_2$ is a monodentate or bidentate neutral ligand structure;

x2 is 0 or an integer of 1 or greater; and y2 is an integer of 1 or greater.)

The compound represented by the formula (ii) (hereafter also called "compound (ii)") employs a phosphorus-containing ligand as a neutral donor for imparting electronic and three-dimensional characteristics. As a result, the compound (ii) can achieve an excellent low melting point, high volatility, and thermal stability, can introduce phosphorus atoms into a phosphorus-containing film, and can be applied to a solid electrolyte for a solid-state battery.

In one embodiment, $E_1$ and $E_2$ in the compound (ii) are preferably a carbon atom or a silicon atom;

$Z_1$ and $Z_2$ are preferably a methylene group or an ethylene group;

$R_{21}$, $R_{22}$, $R_{27}$, and $R_{28}$ are preferably a methyl group, an ethyl group, an n-propyl group, an i-propyl group, an n-butyl group, an i-butyl group, or a t-butyl group;

$R_{22}$ to $R_{26}$ are preferably a hydrogen atom, a methyl group, or an ethyl group;

$D_2$ is preferably a chain or cyclic ether, a chain or cyclic thioether, or a tertiary amine;

x2 is preferably 0 or 1; and y2 is preferably 1.

By specifically having this structure, the compound (ii) can achieve a low melting point, high volatility, and a high level of thermal stability.

In a further embodiment, this compound is preferably represented by the following formula (iii).

Chemical Expression 4

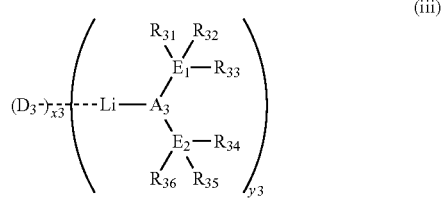

(iii)

(In the formula (iii), $A_3$ is a phosphorus atom, a boron atom, or an aluminum atom:
$E_1$ and $E_2$ are defined the same as in the formula (1);
$R_{31}$ to $R_{36}$ are independently a hydrogen atom or a C1-10 alkyl group having a constituent atom optionally substituted with a heteroatom; however, all of $R_{31}$ to $R_{36}$ may not be a hydrogen atom;
$D_3$ is a monodentate or bidentate neutral ligand structure;
x3 is 0 or an integer of 1 or greater; and y2 is an integer of 1 or greater.)

The compound represented by the formula (iii) (hereafter also called "compound (iii)") can achieve a low melting point, high volatility, and a high level of thermal stability by introduction of a bulky ligand. Development into a solid electrolyte for a solid-state battery can furthermore be anticipated as a result of introduction of phosphorus atoms, boron atoms or aluminum atoms.

In one embodiment, $A_3$ in the compound (iii) is preferably a phosphorus atom;
$E_1$ and $E_2$ are preferably a silicon atom;
$R_{31}$ to $R_{36}$ are preferably a methyl group, an ethyl group, an n-propyl group, or an i-propyl group;
$D_3$ is preferably N,N,N',N'-tetramethylethylenediamine, N,N,N',N'-tetraethylethylenediamine, N,N,N',N'-tetramethyl-1,3-diaminopropane, or N,N,N',N'',N''-pentamethyldiethylenetriamine;
x3 is preferably 0 or 1; and y3 is preferably 1.

By specifically having this structure, the compound (iii) can achieve a low melting point, high volatility, and a high level of thermal stability.

In one embodiment, the compounds (1) and (i) to (iii) (hereafter sometimes called "the compound" without any distinction) are preferably liquids at 25° C., or a temperature demonstrating a vapor pressure of 133.3 Pa is preferably 100° C. or less. As a result, the compound can be present as a liquid or a low melting point solid at room temperature, and a vapor deposition process for forming a lithium-containing film can be carried out efficiently at a low temperature.

In one embodiment, a region having 95% or greater weight loss at 300° C. or less is preferably present according to thermogravimetric analysis of the compound. As a result, the majority of the compound stably volatilizes in this temperature range, which can therefore suppress formation of a residue after reaction, or formation of a residue by decomposition of the compound after volatilizing. That is, the compound can achieve excellent thermal stability by virtue of this weight loss characteristic.

In one embodiment, the compound can be suitably used for thin film vapor deposition by virtue of this characteristic.

In one embodiment, the present invention relates to a method for producing a lithium-containing film, comprising the steps of:
preparing a reaction chamber having at least one substrate placed inside;
introducing a gas containing the vaporized compound into the reaction chamber; and
forming a lithium-containing film on at least a portion of the surface of the substrate using a vapor deposition process for contacting the substrate with the gas.

The compound having a low melting point, enhanced volatility, and thermal stability is used in this production method, which therefore enables transfer thereof without condensation. This can also suppress formation of a residue during the process. As a result, deposition of a lithium-containing film can be carried out efficiently and stably at a lower temperature than conventionally.

In one embodiment, the vapor deposition process is preferably carried out at 200° C. or less. Employing the compound enables a vapor deposition process at a low temperature of 200° C. or less.

In the present specification, the abbreviation "Me" means a methyl group, the abbreviation "Et" means an ethyl group, the abbreviation "Pr" means an n-propyl group (linear propyl group), the abbreviation "iPr" means an isopropyl group (i-propyl group), and the abbreviation "tBu" means a tertiary butyl group (t-butyl group).

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein:

FIG. 1 shows weight change in relation to temperature at atmospheric pressure during thermogravimetric analysis (TGA: atm, m: 14.72 mg, 10° C./min) of $LiN(SiMe_3)_2$ (TMEDA);

FIG. 2 shows weight change in relation to temperature at atmospheric pressure during thermogravimetric analysis (TGA: at, m: 28.77 mg, 10° C./min) of $LiN(SiMe_3)_2$ (1,2-bis(dimethylamino)propane;

FIG. 3 shows weight change in relation to temperature under reduced pressure during thermogravimetric analysis (TGA: vac, m: 17.65 mg, 10° C./min) of $LiN(SiMe_2CH_2PiPr_2)_2$;

FIG. 4 shows the position/thickness relationship for formation of a lithium oxide film formed at 150° C.;

FIG. 5 shows the position/thickness relationship for formation of a lithium oxide film formed at 200° C.;

FIG. 6 shows the position/thickness relationship for formation of a lithium phosphate film formed at 150° C.; and FIG. 7 shows the position/thickness relationship for formation of a lithium phosphate film formed at 200° C.

DETAILED DESCRIPTION OF PREFERRED EMBODIMENTS

An embodiment of the present invention will be described hereinafter with reference to the drawings. The embodiment described below describes an example of the present invention. The present invention is not in any way limited to the following embodiment, and includes various modifications within a scope that does not alter the essence of the present invention. The elements described hereinafter are not all necessarily essential to the present invention.

Compound (1)

The compound according to the present embodiment is represented by the following formula (1).

Chemical Expression 5

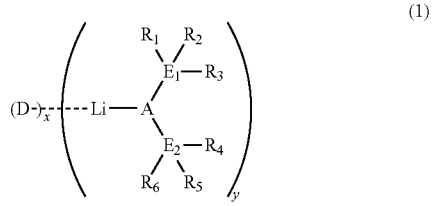

(1)

(In the formula (1), A is a nitrogen atom, a phosphorus atom, a boron atom, or an aluminum atom;

$E_1$ and $E_2$ are independently a carbon atom, a silicon atom, a germanium atom, or a tin atom;

$R_1$ to $R_6$ are independently a hydrogen atom or a C1-10 hydrocarbon group having a constituent atom optionally substituted with a heteroatom; however, all of $R_1$ to $R_6$ may not be a hydrogen atom;

D is a monodentate or polydentate neutral ligand structure;

x is 0 or an integer of 1 or greater, and y is an integer of 1 or greater; however, if A is a nitrogen atom and none of the carbon atoms constituting $R_1$ to $R_6$ is substituted with a heteroatom, x is a number of 1 or greater and y is a number of 1 or greater; and if there are more than one of A, $E_1$, $E_2$, and $R_1$ to $R_6$, these may be the same or different.)

The C1-10 hydrocarbon group having a constituent atom optionally substituted with a heteroatom includes a group in which at least one of the carbon atoms and hydrogen atoms constituting the hydrocarbon group is substituted with a heteroatom other than these two atoms. Heteroatoms which may be cited include: nitrogen atoms, oxygen atoms, phosphorus atoms, boron atoms, sulfur atoms, and halogen atoms (chlorine atoms, fluorine atoms, iodine atoms and bromine atoms), etc.

Examples of C1-10 hydrocarbon groups which may be cited include: a C1-10 chain hydrocarbon group, a C3-10 monovalent alicyclic hydrocarbon group, and a C6-10 monovalent aromatic hydrocarbon group.

Examples of a C1-10 chain hydrocarbon group which may be cited include:

an alkyl group such as a methyl group, ethyl group, n-propyl group, i-propyl group, n-butyl group, 2-methylpropyl group, 1-methylpropyl group, and t-butyl group;

an alkenyl group such as an ethenyl group, propenyl group, or butenyl group; and an alkynyl group such as an ethynyl group, propynyl group, or butynyl group.

Examples of a C3-10 alicyclic hydrocarbon group which may be cited include:

a monocyclic cycloalkyl group such as a cyclopropyl group, cyclobutyl group, cyclopentyl group, or cyclohexyl group;

a polycyclic cycloalkyl group such as a norbornyl group, adamantyl group, or tricyclodecyl group;

a cycloalkenyl group such as a cyclopropenyl group, cyclobutenyl group, cyclopentenyl group, or cyclohexenyl group; and a polycyclic cycloalkenyl group such as a norbornenyl group or tricyclodecenyl group.

Examples of a C6-20 monovalent aromatic hydrocarbon group which may be cited include:

an aryl group such as a phenyl group, tolyl group, xylyl group, or naphthyl group; and an aralkyl group such as a benzyl group or phenethyl group.

The monodentate or polydentate neutral ligand structure is not specifically limited, and a monodentate or polydentate neutral ligand structure which is well known in this technical field may be employed, such as an ether, a thioether, an amine, or an unsaturated hydrocarbon.

Specific examples of a monodentate neutral ligand structure which may be cited include: tetrahydrofuran (THF), dioxane, pyridine, pyrrole, imidazole, dimethyl ether, diethyl ether, methyl ethyl ether, dipropyl ether, di-i-propyl ether, dimethyl thioether, diethyl thioether, methyl ethyl thioether, and cyclopentadiene, etc.

Specific examples of a bidentate neutral ligand structure which may be cited include: 1,2-dimethoxyethane (DME), 1,2-diethoxyethane, bipyridine, diene, N,N,N',N'-tetramethylethylenediamine (TMEDA), N,N,N',N'-tetraethylethylenediamine (TEEDA), and 1,2-bis(dimethylamino)propane, etc.

Specific examples of a tridentate neutral ligand structure which may be cited include: triene, diglyme (diethylene glycol dimethyl ether), and N,N,N',N'',N''-pentamethyldiethylenetriamine (PMDTA), etc.

Compound (i)

As one embodiment, the compound (1) is preferably represented by the following formula (i).

Chemical Expresssion 6

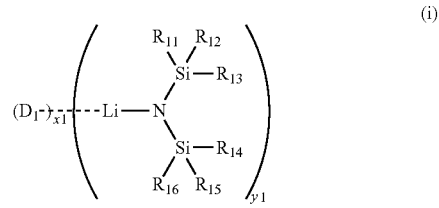

(i)

(In the formula (i), $R_1$ to $R_{16}$ are independently a hydrogen atom or a C1-10 alkyl group having a constituent atom optionally substituted with a heteroatom; however, all of $R_{11}$ to $R_{16}$ may not be a hydrogen atom;

$D_1$ is a bidentate or tridentate neutral ligand structure; and x1 and y1 are independently an integer of 1 or greater.)

The same alkyl group as that of the compound (1) may be suitably used as the C1-10 alkyl group having a constituent atom optionally substituted with a heteroatom.

The bidentate or tridentate neutral ligand structures in the compound (1) may be cited as suitable bidentate or tridentate neutral ligand structures, although there is no specific limitation.

Among these structures, $R_{11}$ to $R_{16}$ in the formula (i) are preferably all methyl groups;

$D_1$ is preferably 1,2-diethoxyethane, diethylene glycol dimethyl ether, N,N,N',N'-tetramethylethylenediamine, N,N,N',N'-tetraethylethylenediamine, 1,2-bis(dimethylamino)propane, or N,N,N',N'',N''-pentamethyldiethylenetramine; and x1 and y1 are preferably 1.

Specific examples of the compound (i) which may be cited include:

LiN(SiMe$_3$)$_2$ (1,2-diethoxyethane), LiN(SiMe$_3$)$_2$ (diglyme), LiN(SiMe$_3$)$_2$ (TMEDA), LiN(SiMe$_3$)$_2$ (1,2-bis(dimethylamino)propane, LiN(SiMe$_3$)$_2$ (TEEDA), and LiN(SiMe$_3$)$_2$ (PMDTA), etc.

Compound (ii)

As one embodiment, the compound (1) is preferably represented by the following formula (ii).

Chemical Expression 7

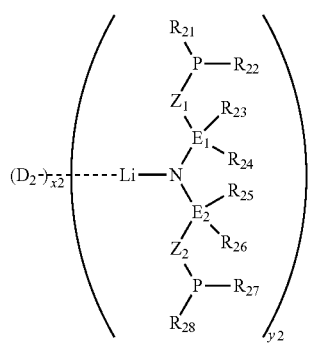

(In the formula (ii), E$_1$ and E$_2$ are defined the same as in the formula (1);

Z$_1$ and Z$_2$ are independently a single bond or a divalent linking group;

R$_{21}$ to R$_{28}$ are independently a hydrogen atom or a C1-10 alkyl group having a constituent atom optionally substituted with a heteroatom; however, all of R$_{21}$ to R$_{28}$ may not be a hydrogen atom;

D$_2$ is a monodentate or bidentate neutral ligand structure;

x2 is 0 or an integer of 1 or greater; and y2 is an integer of 1 or greater.)

Examples of the divalent linking group which may be cited include: a C1-10 divalent linear or branched hydrocarbon group, a C4-12 divalent alicyclic hydrocarbon group, or a group constituted from one or more of these hydrocarbon groups and at least one group from among —CO—, —O—, —NH—, and —S—, etc.

The same alkyl group as that of the compound (1) may be suitably used as the C1-10 alkyl group having a constituent atom optionally substituted with a heteroatom.

The monodentate or bidentate neutral ligand structures in the compound (1) may be cited as suitable monodentate or bidentate neutral ligand structures, although there is no specific limitation.

Among these, E$_1$ and E$_2$ in the compound (ii) are preferably a carbon atom or a silicon atom;

Z$_1$ and Z$_2$ are preferably a methylene group or an ethylene group;

R$_{21}$, R$_{22}$, R$_{27}$, and R$_{28}$ are preferably a methyl group, an ethyl group, an n-propyl group, an i-propyl group, an n-butyl group, an i-butyl group, or a t-butyl group;

R$_{22}$ to R$_{28}$ are preferably a hydrogen atom, a methyl group, or an ethyl group;

D$_2$ is preferably a chain or cyclic ether, a chain or cyclic thioether, or a tertiary amine;

x2 is preferably 0 or 1; and y2 is preferably 1.

Specific examples of the compound (ii) which may be cited include:

LiN(SiMe$_2$CH$_2$PMe$_2$)$_2$, LiN(SiMe$_2$CH$_2$PEt$_2$)$_2$, LiN(SiMe$_2$CH$_2$PEt$_2$)$_2$ (dioxane), LiN(SiMe$_2$CH$_2$PEt$_2$)$_2$ (THF), LiN(SiMe$_2$CH$_2$PEt$_2$)$_2$ (nPrMe), LiN(SiMe$_2$CH$_2$PEt$_2$)$_2$ (iPr$_2$O), LiN(CH$_2$CH$_2$PMe$_2$)$_2$, LiN(CH$_2$CH$_2$PEt$_2$)$_2$, LiN(CH$_2$CH$_2$PiPr$_2$)$_2$, and LiN(CH$_2$CH$_2$PtBu$_2$)$_2$, etc.

In one embodiment, the compound (1) is preferably represented by the following formula (iii).

Chemical Expression 8

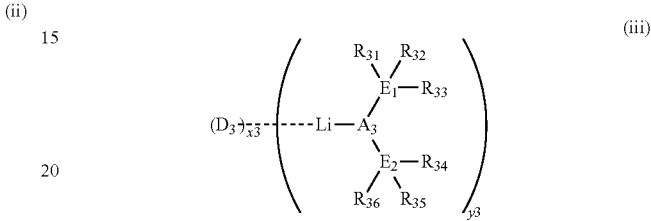

(In the formula (iii), A$_3$ is a phosphorus atom, a boron atom, or an aluminum atom;

E$_1$ and E$_2$ are defined the same as in the formula (1);

R$_{31}$ to R$_{36}$ are independently a hydrogen atom or a C1-10 alkyl group having a constituent atom optionally substituted with a heteroatom; however, all of R$_{31}$ to R$_{36}$ may not be a hydrogen atom;

D$_3$ is a monodentate or bidentate neutral ligand structure;

x3 is 0 or an integer of 1 or greater; and y2 is an integer of 1 or greater.)

The same alkyl group as that of the compound (1) may be suitably used as the C1-10 alkyl group having a constituent atom optionally substituted with a heteroatom.

The monodentate or bidentate neutral ligand structures in the compound (1) may be cited as suitable monodentate or bidentate neutral ligand structures, although there is no specific limitation.

Among these, A$_3$ in the compound (iii) is preferably a phosphorus atom;

E$_1$ and E$_2$ are preferably a silicon atom;

R$_{31}$ to R$_{36}$ are preferably a methyl group, an ethyl group, an n-propyl group, or an i-propyl group;

D$_3$ is preferably, N,N,N',N'-tetramethylethylenediamine, N,N,N',N'-tetraethylethylenediamine, N,N,N',N'-tetramethyl-1,3-diaminopropane, or N,N,N',N'',N''-pentamethyldiethylenetriamine;

x3 is preferably 0 or 1; and y3 is preferably 1.

Specific examples of the compound (iii) which may be cited include LiN(SiMe$_3$)$_2$, LiP(SiMe$_3$)$_2$ (TMEDA) and LiP(SiMe$_3$)$_2$ (PMDTA), etc.

In the present embodiment, the compound is preferably a liquid at 25° C., or a temperature demonstrating a vapor pressure of 133.3 Pa is preferably 100° C. or less. The temperature demonstrating a vapor pressure of 133.3 Pa is more preferably 90° C. or less. As a result, the compound can be present as a liquid or a low melting point solid at room temperature, and a vapor deposition process for forming a lithium-containing film can be carried out efficiently at a low temperature.

In the present embodiment, there is preferably a region having 95% or greater weight loss at 300° C. or less in thermogravimetric analysis, more preferably a region having 95% or greater weight loss at 280° C. or less, and even more preferably a region having 95% or greater weight loss at 250° C. or less. As a result, the majority of the compound stably volatilizes in this temperature range, which can therefore suppress formation of a residue after reaction, or formation of a residue by decomposition of the compound after volatilizing. That is, the compound can achieve excellent thermal stability by virtue of this weight loss characteristic.

In the present embodiment, the compound can be suitably used for thin film vapor deposition by virtue of this characteristic. Although not limited, examples of suitable vapor deposition methods which may be cited include heat, plasma, or remote plasma processes, or a combination of these processes, in atomic layer deposition (ALD), plasma enhanced atomic layer deposition (PE-ALD), chemical vapor deposition (CVD), pulsed chemical vapor deposition (P-CVD), and low pressure chemical vapor deposition (LPCVD).

Method for Producing the Compound

The compound (1) and preferred embodiments of compounds (i) to (iii) may be produced using a method which is well known in this technical field. For example, the compound (i) may be obtained by reacting a corresponding lithium amide and a compound corresponding to a neutral ligand structure, in a solvent (such as toluene). The compound (ii) may be obtained by first reacting an alkyl phosphate and an organic lithium compound to prepare a lithium alkyl phosphate, then reacting this with a terminal halogenated alkylamine, and finally reacting with an organic lithium compound. The compound (iii) may be obtained by reacting a corresponding lithium amide and a compound corresponding to a neutral ligand structure, in a solvent (such as toluene). Other structures may also be produced by appropriately modifying the above methods.

Method for Producing a Lithium-Containing Film

The method for producing a lithium-containing film according to the present embodiment comprises the steps of:
preparing a reaction chamber having at least one substrate placed inside;
introducing a gas containing the vaporized compound into the reaction chamber; and
forming a lithium-containing film on at least a portion of the surface of the substrate using a vapor deposition process for contacting the substrate with the gas.

Reaction Chamber Preparation Step

In this step, a reaction chamber having at least one substrate placed inside is prepared. The type of substrate on which the lithium-containing film is deposited is suitably selected depending on the final application. In several embodiments, the substrate may be selected from among oxides used as an insulating material in MIM, DRAM, or FeRAM technology (for example, an $HfO_2$ base material, a $TiO_2$ base material, a $ZrO_2$ base material, a rare earth oxide base material, or a ternary oxide base material, etc.) or from among nitride base films used as an oxygen barrier between copper and a low-k film (for example, TaN). Other substrates may be used to produce a semiconductor, a photovoltaic cell, an LCD-TFT, or a flat panel device. Although not limited, examples of such substrates which may be cited include other substrates including any from among solid substrates such as metal nitride-containing substrates (for example, TaN, TiN, WN, TaCN, TiCN, TaSiN, and TiSiN); insulators (for example, $SiO_2$, $Si_3N_4$, SiON, $HfO_2$, $Ta_2O_5$, $ZrO_2$, $TiO_2$, $Al_2O_3$, and barium strontium titanate); or combinations of these materials. The actual substrate used also depends on the specific embodiment of the compound used.

The reaction chamber may be any closed container or chamber of a device inside which vapor deposition is carried out. Although not limited, specific examples which may be cited include: a parallel plate reactor, a cold wall reactor, a hot wall reactor, a sheet reactor, a multi-wafer reactor, or another type of deposition system.

Gas Introduction Step

In this step, a gas containing the vaporized compound is introduced into the reaction chamber. A neat (single) compound or a blended (multiple) compound may be supplied in a liquid state to a vaporizer, where the compound is vaporized before being introduced into the reaction chamber. Alternatively, the compound may be vaporized by passing a carrier gas through a container containing the compound or by bubbling a carrier gas into the compound. Next, the carrier gas and the gas containing the vaporized compound are introduced into the reaction chamber. If necessary, the container may be heated to a temperature that enables the compound to have a sufficient vapor pressure. Although not limited, Ar, He, $N_2$, and mixtures thereof may be cited as carrier gases. An oxygen supply source may also be provided; for example, $O_3$, $O_2$, NO, $H_2O$, $H_2O_2$, a ($C_1$-$C_{10}$ linear or branched) carboxylic acid, acetic acid, formalin, formic acid, an alcohol, para-formaldehyde, and combinations thereof; preferably $O_3$, $O_2$, $H_2O$, NO, and combinations thereof; and more preferably $H_2O$. The container can be kept at a temperature in a range of about 0° C. to about 150° C., for example. A person who is skilled in the art will understand that the temperature of the container may be adjusted by a known method so that the quantity of compound vaporized can be controlled.

The compound may be supplied in a pure form (for example, as a liquid or a low melting point solid) or in a blended form with a suitable solvent. Although not limited, exemplary solvents which may be cited include: an aliphatic hydrocarbon, an aromatic hydrocarbon, a heterocyclic hydrocarbon, an ether, a glyme, a glycol, an amine, a polyamine, a cyclic amine, an alkylated amine, and mixtures thereof. Examples of preferred solvents which may be cited include: ethylbenzene, diglyme, triglyme, tetraglyme, pyridine, xylene, mesitylene, decane, dodecane, and mixtures thereof. The concentration of the compound is typically in a range of about 0.02 M to about 2.0 M, and preferably a range of about 0.05 M to about 0.2 M.

In addition to optional mixing of the compound and the solvent before introduction into the reaction chamber, the gas containing the vaporized compound may be mixed with reaction species inside the reaction chamber. Although not limited, exemplary reactive species which may be cited include a metal precursor, such as a strontium-containing precursor, a barium-containing precursor, or an aluminum-containing precursor such as TMA, for example, and any combination thereof.

The reaction chamber may be kept at a pressure in a range of about 0.5 mTorr to about 20 Torr. In addition, the temperature inside the reaction chamber may be in a range of about 50° C. to about 600° C., and preferably a range of about 80° C. to about 550° C. A person who is skilled in the art will be able to optimize the temperature by experience to achieve the desired result.

The substrate may be heated to a sufficient temperature to obtain the desired lithium-containing film in the desired physical state and at a sufficient growth rate. An example of a non-limiting exemplary temperature range capable of heating the substrate is 50° C. to 500° C. The substrate is preferably kept at a temperature of 300° C. or less.

Lithium-Containing Film Formation Step

In this step, a lithium-containing film is formed on at least a portion of the surface of the substrate using a vapor deposition process for contacting the substrate with the gas. In one exemplary atomic layer deposition process, the vapor phase of the compound is introduced into the reaction chamber, where it is contacted with a suitable substrate. Subsequently, excess compound is removed from the reaction chamber by purging and/or evacuating the reaction chamber. An oxygen supply source is introduced into the reaction chamber where it reacts in a self-limiting manner with the absorbed compound. Subsequently, the excess oxygen supply source is removed from the reaction chamber by purging and/or evacuating the reaction chamber. When the desired film is a lithium oxide film, this two-step process may provide the desired film thickness, or the two-step process may be repeated until a film having the necessary thickness is obtained.

Alternatively, when the desired film is a lithium metal oxide film, a vapor of the metal precursor may continue to be introduced into the reaction chamber following this two-step process. The metal precursor is selected on the basis of the properties of the lithium metal oxide to be deposited. The compound contacts the substrate after being introduced into the reaction chamber, Excess compound is removed from the reaction chamber by purging and/or evacuating the reaction chamber. An oxygen supply source may be introduced again into the reaction chamber to react with the metal precursor. The excess oxygen supply source is removed from the reaction chamber by purging and/or evacuating the reaction chamber. This process may be ended once the desired film thickness is obtained. The whole of the four-step process may be repeated, however, if a thicker film is desired. A film of the desired composition and thickness can be deposited by interchanging supply of the compound, the metal precursor, and the oxygen supply source.

The lithium-containing film or lithium-containing layer obtained by the production method of the present embodiment may have the general formula $Li_xM_yO_z$ (where M=Ni, Co, Fe, V, Mn, or P, and x, y, and z are in a range of 1 to 8). Preferably, the lithium-containing film is selected from among $Li_xNiO_2$, $Li_xCoO_2$, $Li_xV_3O_8$, $Li_xV_2O_5$, and $Li_xMn_2O_4$, where x is in a range of 1 to 8. A person who is skilled in the art will be able to obtain the desired film composition by suitably selecting a suitable compound and reactive species.

The composition of the film to be deposited depends on the application. For example, the lithium-containing film may be used for a fuel cell or storage battery application.

EXAMPLES

The present invention will be described in greater detail using examples, but the present invention is not limited to the following examples, as other examples are possible within the scope of the present invention.

Synthesis of Compound (i): $LiN(SiMe_3)_2$ (TMEDA)

$LiN(SiMe_3)_2$ (2 g, 12 mmol) was dissolved in toluene (40 mL), and N,N,N',N'-tetramethylethylenediamine (1.8 mL, 12 mmol) was slowly added thereto at 0° C. The resulting solution was stirred for 1 hour, then volatile substances were removed under vacuum. A white solid was isolated and washed with pentane. The crude substance was purified by sublimation to obtain 3.12 g of the white solid. Yield (92%). $^1$HNMR ($C_6D_6$, 400 MHz): 1.75 ppm (s, 12H), 1.48 ppm (m, 4H), 0.38 ppm (s, 18H)

FIG. 1 shows weight change in relation to temperature at atmospheric pressure during thermogravimetric analysis (TGA: "TGA/DSC 3+ STAR$^e$ System", produced by Mettler Toledo, atm, m: 14.72 mg, 10° C./min) of $LiN(SiMe_3)_2$ (TMEDA).

Synthesis of Compound (i): $LIN(SiMe_3)_2$(1,2-bis(dimethylamino)propane)

1,2-Bis(dimethylamino)propane (2.89 mL, 18 mmol) was added dropwise at 0° C. to a toluene (30 mL) solution of $LiN(SiMe_3)_2$ (2 g, 12 mmol). The reaction mixture was then stirred overnight. The following day, the solvent was removed under vacuum. The crude substance was refined by distillation under vacuum (95 to 97° C., 15 Pa) to obtain 922 mg of a colorless oily material. Yield (26%). $^1$HNMR ($C_6D_6$, 400 MHz): 2.1 ppm (m, 1H), 2 to 1.6 ppm (m, 13H), 1.2 ppm (dd, 1H, $^3J_{H-H}$=13.3 Hz, $^3J_{H-H}$=3.2 Hz), 0.32 ppm (s, 18H), 0.21 ppm (dd, 3H, J=6.4 Hz)

FIG. 2 shows weight change in relation to temperature at atmospheric pressure during thermogravimetric analysis (TGA: at, m: 28.77 mg, 10° C./min) of $LiN(SiMe_3)_2$(1,2-bis(dimethylamino)propane.

Synthesis of Compound (ii): $LiN(SiMe_2CH_2PiPr_2)_2$ $LiN(SiMe_2CH_2PiPr_2)_2$ was synthesized by nucleophilic substitution of chlorine by an $iPr_2PLi$ salt in accordance with the improved method described in Inorg. Chem. 2002, 41, 5615.

n-BuLi (133 mL, 1.6 M solution, 0.213 mol) in hexane was added to a THF (250 mL) solution of diisopropylphosphine (25 g, 0.213 mol) at −78° C. The resulting solution was yellow, and $iPr_2PLi$ was apparent. Subsequently, the cold bath was removed and the reaction mixture was stirred at room temperature for 1 hour. Next, $(ClCH_2SiMe_2)_2NH$ (15.6 mL, 71 mmol) was added dropwise at 0° C. The reaction mixture was stirred for 45 minutes and the reaction mixture changed to colorless. A second portion of n-BuLi (44 mL, 1.6 M solution, 71 mmol) was slowly added at 0° C. The reaction solution turned yellow and was stirred and mixed for 45 minutes. $(ClCH_2SiMe_2)_2NH$ 5.2 mL, 23.7 mL) was added, and stirred and mixed for a further 45 minutes. Finally, a third portion of n-BuLi (15 mL, 1.6 M solution, 23.7 mmol) was added at 0° C. The reaction solution turned yellow and was stirred and mixed for 45 minutes. $(ClCH_2SiMe_2)_2NH$ (1.76 mL, 7.9 mL) was added, and stirred and mixed for a further 45 minutes. Next, the solvent was removed under vacuum and the residue was extracted with hexane (150 mL). After filtration through a celite pad to remove LiCl, hexane was evaporated off to obtain an orange oily material. The crude substance was distilled under reduced pressure (140 to 150° C., 20 Pa) to obtain 1 g of a colorless oily material. Yield (73%). $^1$HNMR ($C_6D_6$, 400 MHz): 1.70 ppm (m, 4H), 1.06 ppm (m, 24H), 0.69 ppm (d, 4H, $^2J_{H-P}$=5.9 Hz), 0.48 ppm (s, 12H).

FIG. 3 shows weight change in relation to temperature under reduced pressure during thermogravimetric analysis (TGA: vac, m: 17.65 mg, 10° C./min) of $LiN(SiMe_2CH_2PiPr_2)_2$.

Comparative Substance

LiOtBu (produced by Sigma-Aldrich) was used as a comparative substance.

The prepared compounds and the comparative substance had the following characteristics. The melting point and vapor pressure were measured by the thermogravimetric analysis described earlier.

TABLE 1

| Compound | Melting Point | Vapor pressure |
|---|---|---|
| LiN(SiMe$_3$)$_2$ (TMEDA) | 60-62° C. | 81° C., 133.3 Pa |
| LiN(SiMe$_3$)$_2$ (1,2-bis(dimethylamino)propane) | Liquid at 25° C. | 85° C., 133.3 Pa |
| LiN(SiMe$_2$CH$_2$PiPr$_2$)$_2$ | Liquid at 25° C. | 144° C., 133.3 Pa |
| LiOtBu | 148-150° C. | 140° C., 106.7 Pa |

Formation of Lithium-Containing Film Using LiN(SiMe$_2$CH$_2$PiPr$_2$)$_2$

A silicon or amorphous carbon substrate (about 20 mm×about 20 mm×thickness about 0.75 mm) was introduced into an ALD reactor or a CVD reactor. Next, the substrate was heated in a nitrogen atmosphere to a set point of 100 to 500° C. for each experiment. When the set value had been reached, the reactor was flushed with LiN(SiMe$_2$CH$_2$PiPr$_2$)$_2$ serving as the compound, an oxygen source, and a carrier gas, and a film was deposited on the substrate. During this process, water vapor or oxygen was used as the oxygen source, nitrogen was used as the carrier gas, and the pressure was kept at 266.6 Pa.

As a result, when water vapor was used as the oxygen source, a lithium oxide film was deposited by means of ALD at 100° C., 120° C., 150° C., 175° C., 200° C., and 250° C. A lithium oxide film was furthermore obtained by means of CVD at 200° C., 300° C., and 400° C., whereas a lithium silicate film was deposited by means of CVD at 500° C. Meanwhile, a lithium oxide film was deposited by means of ALD at 100° C., 120° C., 150° C., 175° C., 200° C., and 250° C., with oxygen serving as the oxygen source. The following table shows the compositions of typical lithium oxide films and lithium silicate films on an Si substrate. The film compositions were evaluated using an X-ray photoelectron spectrometer ("K-Alpha" produced by ThermoScientific, in a vacuum at room temperature (without heating)).

TABLE 2

| Deposition method | Temperature [° C.] | Film composition (molar ratio in parentheses) |
|---|---|---|
| ALD Compound: LiN(SIMe$_2$CH$_2$PiPr$_2$)$_2$ Oxygen source: Water or O$_2$ | 100 | Li(1)O(1) + <10% C |
| ALD Compound: LiN(SIMe$_2$CH$_2$PiPr$_2$)$_2$ Oxygen source: Water or O$_2$ | 150 | Li(1)O(1) + <10% C |
| CVD Compound: LiN(SiMe$_2$CH$_2$PiPr$_2$)$_2$ Oxygen source: Water | 200 | Li(1)O(1) + <10% C, P |
| CVD Compound: LiN(SiMe$_2$CH$_2$PiPr$_2$)$_2$ Oxygen source: Water | 500 | Li(2.0)Si(2.4)O(4.) |

The deposition rates in the ALD experiments at 100° C., 150°, and 200° C. on an Si substrate are indicated below. Each experiment employed 200 cycles of an LiN(SiMe$_2$CH$_2$PiPr$_2$)$_2$ pulse, a water vapor or oxygen pulse, and purging. The deposition rates were measured by using film thickness measurement employing spectral ellipsometry ("UVISEL", analysis software "DeltaPsi2", produced by HORIBA Jobin Yvon, under the atmosphere, at room temperature).

TABLE 3

| | Deposition rate | |
|---|---|---|
| Temperature [° C.] | Oxygen source: Water (Å/cycle) | Oxygen source: Oxygen (Å/cycle) |
| 100 | 0.4 | 0.4 |
| 150 | 0.95 | 0.3 |
| 200 | 1 | 0.5 |

The lithium oxide films formed at 150° C. and 200° C. were evaluated for uniformity of film thickness. The thickness of the lithium oxide films obtained was measured at a total of six points every 10 cm or 20 cm. FIG. 4 shows the position/thickness relationship for formation of a lithium oxide film formed at 150° C. FIG. 5 shows the position/thickness relationship for formation of a lithium oxide film formed at 200° C. The film thickness was measured using the spectral ellipsometry described earlier.

Formation of Lithium Phosphate Film Using ALD

The deposition rates in the ALD experiments at 100° C., 150° C., and 200° C. on an Si substrate are indicated below. Each experiment employed 400 cycles of an LiN(SiMe$_3$)$_2$ pulse, a trimethyl phosphate pulse, and purging. A tube furnace was used, and the 30-cm position was deemed the center point of the furnace.

TABLE 4

| Temperature [° C.] | Deposition rate (Å/cycle) |
|---|---|
| 100 | 0.07 |
| 150 | 0.12 |
| 200 | 0.38 |

The lithium phosphate films formed at 150° C. and 200° C. were evaluated for uniformity of film thickness. The thickness of the lithium phosphate films obtained was measured at a total of six points every 10 cm. FIG. 6 shows the position/thickness relationship for formation of a lithium phosphate film formed at 150° C. FIG. 7 shows the position/thickness relationship for formation of a lithium phosphate film formed at 200° C. The film thickness was measured using the spectral ellipsometry described earlier.

Lithium-containing films could be obtained at 100° C., 150° C., and 200° C. at a high deposition rate by using LiN(SiMe$_2$CH$_2$PiPr$_2$)$_2$, and water as an oxygen source. The deposition rate at low temperatures (100 and 150° C.) was seven to eight times higher than a conventional deposition procedure employing LiN(SiMe$_3$)$_2$ and trimethyl phosphate. Good uniformity was observed at 150° C. and 200° C., although the deposition rate for forming a lithium oxide film was much higher than for forming a lithium phosphate film.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

The invention claimed is:

1. A compound represented by the following formula (3)

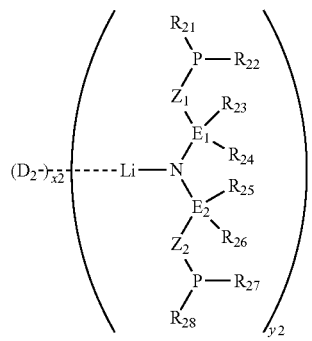

wherein:
- $E_1$ and $E_2$ are independently a carbon atom, a silicon atom, a germanium atom, or a tin atom;
- $Z_1$ and $Z_2$ are independently a single bond or a divalent linking group;
- R21 to R28 are independently a hydrogen atom, a C1-10 hydrocarbon group, or a C1-10 having one or more carbons substituted with a heteroatom, and provided that R21 to R28 are not all a hydrogen atom;
- $D_2$ is a monodentate or bidentate neutral ligand structure;
- x2 is 0 or an integer of 1 or greater; and y2 is an integer of 1 or greater.

2. The compound according to claim 1, wherein $E_1$ and $E_2$ are a carbon atom or a silicon atom; $Z_1$ and $Z_2$ are a methylene group or an ethylene group; R21, R22, R27, and R28 are independently a methyl group, an ethyl group, an n-propyl group, an i-propyl group, an n-butyl group, an i-butyl group, or a t-butyl group;
- R22 to R26 are independently a hydrogen atom, a methyl group, or an ethyl group; $D_2$ is a chain or cyclic ether, a chain or cyclic thioether, or a tertiary amine; x2 is 0 or 1; and
- y2 is 1.

3. The compound according to claim 1, wherein the compound a) is a liquid at 25° C., b) has a temperature demonstrating a vapor pressure of 133.3 Pa is 100° C. or less, or c) both a) and b).

4. The compound according to claim 1, wherein a region having 95% or greater weight loss at 300° C. or less is present according to thermogravimetric analysis.

5. A method for producing a lithium-containing film comprising the steps of:
- preparing a reaction chamber having at least one substrate placed inside;
- introducing a gas containing the vaporized compound according to claim 1 into the reaction chamber; and
- forming a lithium-containing film on at least a portion of a surface of the substrate using a vapor deposition process for contacting the substrate with the gas.

6. The method for producing a lithium-containing film according to claim 5, wherein the vapor deposition process is carried out at 200° C. or less.

* * * * *